United States Patent
Maeda et al.

[11] Patent Number: 5,818,323
[45] Date of Patent: Oct. 6, 1998

[54] MAGNETORESISTIVE DEVICE

[75] Inventors: Atsushi Maeda, Neyagawa; Satoru Oikawa, Yao; Toshio Tanuma, Toyonaka; Minoru Kume, Shijonawate; Kazuhiko Kuroki, Uji, all of Japan

[73] Assignee: Sanyo Electric Co., Ltd., Moriguchi, Japan

[21] Appl. No.: 524,751

[22] Filed: Sep. 7, 1995

[30] Foreign Application Priority Data

Sep. 9, 1994 [JP] Japan ..................................... 6-216353
Sep. 9, 1994 [JP] Japan ..................................... 6216351

[51] Int. Cl.⁶ .................................................. H01L 43/00
[52] U.S. Cl. .......................... 338/32 R; 360/113; 428/546
[58] Field of Search ........................ 338/32 R; 428/546; 360/113; 324/207.21, 252

[56] References Cited

U.S. PATENT DOCUMENTS

| | | | |
|---|---|---|---|
| 3,256,483 | 6/1966 | Broadbent | 338/32 R |
| 3,341,772 | 9/1967 | Weiss | 324/252 |
| 4,477,794 | 10/1984 | Nomura et al. | 338/32 R |
| 4,712,083 | 12/1987 | Heck et al. | 338/32 R |
| 5,043,693 | 8/1991 | Edelstein | 338/32 R |
| 5,243,316 | 9/1993 | Sakakima et al. | 338/32 R |
| 5,268,043 | 12/1993 | McCowen | 148/310 |
| 5,365,212 | 11/1994 | Saito et al. | 338/32 R |
| 5,422,621 | 6/1995 | Gambino et al. | 338/32 R |
| 5,432,494 | 7/1995 | Inoue et al. | 338/32 R |
| 5,462,809 | 10/1995 | Berkowitz | 428/611 |
| 5,463,516 | 10/1995 | Valet et al. | 338/32 R |
| 5,569,544 | 10/1996 | Daughton | 338/32 R |
| 5,585,198 | 12/1996 | Maeda et al. | 428/611 |
| 5,620,784 | 4/1997 | Tanuma et al. | 428/212 |
| 5,656,381 | 8/1997 | Maeda et al. | 428/611 |

FOREIGN PATENT DOCUMENTS

0581295 A1  2/1994  European Pat. Off. ............ 338/32 R
6-169117  6/1994  Japan .................................... 338/32 R

OTHER PUBLICATIONS

A.E. Berkowitz "Giant Magnetoreistance in Heterogenoues Cu–Co Alloys" Phys. Rev. Let, V. 68, No. 25, pp. 3745–3748, (Jun. 1992).

D. H. Mosca et al. "Oscillatory interlayer coupling and giant magnetoresistance in Co/Cu multilayers" Journal of Magnetism and Magnetic Materials 94 (1991), pp. L.1–L.5.

Dieny et al. "Giant magnetoresistance of magnetically soft sandwiches: dependence on temperature and on layer thicknesses" Pysical Review B (1992) Jan. pp. 806–813 vol.45 No.2.

A. Chaiken et al. "Low–field spin–valve magnetoresistance in Fe–Cu–Co sandwiches" Appl. Phys. Lett. 59 Jul. 1991, pp. 240–242.

Atsushi Maeda et al. "Magnetoresistance characteristics of grain–type alloy thin films of various compositions" J. Phys.: Condens. Matter 5(1993) pp. 6745–6752.

Atsushi Maeda et al. "Giant magnetoresistance effect in grain–type alloy thin films" J. Phys.: Condens. Matter 5 (1993) pp. L189–L194.

*Primary Examiner*—Michael L. Gellner
*Assistant Examiner*—Karl Easthom
*Attorney, Agent, or Firm*—W. F. Fasse; W. F. Fasse

[57] ABSTRACT

A magnetoresistive device has an alloy film, including a ferromagnetic substance and a non-magnetic substance which is not soluble in solid phase in the ferromagnetic substance or is in a eutectic relation with the ferromagentic substance. The ferromagnetic substance forms grains in the non-magnetic substance, and the grains preferably have anisotropic shapes. The non-magnetic substance is conducting. The alloy film is composed of a plurality of alloy film stripes. Alternatively the magneto-resistive device includes a non-magnetic layer arranged between first and second magnetic layers, wherein the non-magnetic layer has 10 to 50 weight percent of grains of a magnetic substance dispersed therein.

18 Claims, 8 Drawing Sheets

MAGNETORESISTIVE DEVICE

CROSS REFERENCE TO RELATED APPLICATIONS

The present application is related to the following U.S. application Ser. Nos. 08/216,185, filed on Mar. 22, 1994, and issued as U.S. Pat. No. 5,656,381 on Aug. 12, 1997; 08/326,731, filed on Oct. 20, 1994 and issued as U.S. Pat. No. 5,585,198 on Dec. 17, 1996; 08/406,671, filed on Mar. 20, 1995, now allowed; and 08/511,012, filed on Aug. 3, 1995 and issued as U.S. Pat. No. 5,620,784 on Apr. 15, 1997.

BACKGROUND OF THE INVENTION

1. Field of the Invention

The present invention relates to a magnetoresistive device (MR device) such as a magnetoresistive head (MR head) or a magnetic sensor (MR sensor).

2. Description of the Background Art

A magnetoresistive device is adapted to measure magnetic field strength and its change by detecting the change in electric resistance of a magnetic film which is caused by application of the magnetic field to the magnetic film. In general, therefore, the magnetoresistive device must have a high magnetoresistance ratio. The material for the magnetoresistive device is generally prepared from an Fe—Ni alloy (Permalloy). However, the Fe—Ni alloy exhibits insufficient properties as a magnetic material for the magnetoresistive device since the same has an extremely small magnetoresistance ratio of 2 to 3%.

There has recently been proposed a multilayer magnetic film which is formed by alternately stacking Co and Cu layers with each other, as a magnetoresistive film exhibiting gigantic magnetoresistance change (D. H. Mosca et al., J. Magn. Mater., 94 (1991) L1). In such a magnetic film, antiferromagnetic coupling is defined between the Co layers, which are magnetic layers, through the Cu layer, which is a non-magnetic layer, to provide antiparallel and parallel magnetic moment states and exhibit high magnetoresistance change. Such a magnetoresistive film is generally called an artificial lattice type film.

On the other hand, a multilayer magnetic film having first and second magnetic layers, which are different in coercive force from each other, with a non-magnetic layer arranged therebetween is known as another magnetoresistive film exhibiting gigantic magnetoresistance change. A known example of such a multilayer film is that having a Co layer and an MnFe/NiFe layer as first and second magnetic layers, with a Cu layer arranged therebetween as a non-magnetic layer (B. Dieny et al., Phys. Rev., B. 45 (1992) 806). In such a magnetic film, difference is caused between magnetization processes of the NiFe layer and the Co layer since the MnFe layer is made of an antiferromagnetic substance, to provide a region having antiparallel magnetic moment by magnetic field strength. Thus, this magnetic film exhibits high magnetoresistance change. Such a magnetoresistive device is generally called a spin valve type element.

Further, a multilayer magnetic film having Fe and Co layers which are provided with a Cu layer therebetween is known as a sandwich type magnetic film having magnetic layers of different coercive force through a non-magnetic layer (A. Chaiken et al., Appl. Phys. Lett., 59 (1991) 240). Such a multilayer magnetic film has a region having antiparallel magnetic moment in the magnetization process due to the difference in coercive force between the magnetic layers, to exhibit high magnetoresistance change.

Responsive to improvements in the recording density of a magnetic recording medium, however, a magnetic film exhibiting higher magnetoresistance change is desired. The aforementioned conventional magnetoresistive films are still insufficient in magnetoresistance change.

SUMMARY OF THE INVENTION

An object of the present invention is to provide a novel structure of a magnetoresistive film exhibiting magnetoresistance change which is higher than that in the prior art.

A magnetoresistive device (magnetoresistive element) according to a first aspect of the present invention comprises an alloy film consisting of a ferromagnetic substance and a non-magnetic substance which is not soluble in solid phase or is in eutectic relation with the ferromagnetic substance, so that the ferromagnetic substance forms grains in the non-magnetic substance, and the grains of the ferromagnetic substance have form anisotropy, i.e. anisotropic shapes.

Namely, the grains of the ferromagnetic substance are not in the form of spheres but distorted in a specific direction. For example, the grains may be flatly spread along specific two-dimensional directions, or in the form of rugby balls extending in a specific one-dimensional direction. In such anisotropy, the longer diameter or dimension of each grain is preferably about 1.3 to 3 times the shorter diameter or dimension, for example.

A magnetoresistive device according to a second aspect of the present invention comprises an alloy film consisting of a ferromagnetic substance and a non-magnetic substance which is not soluble in solid phase or is in eutectic relation with the ferromagnetic substance, so that the ferromagnetic substance forms grains in the non-magnetic substance, and a width of the alloy film is not more than about 1 $\mu$m.

In one of preferred modes according to the second aspect of the present invention, the alloy film is provided in the form of stripes, so that the width of each stripe is not more than about 1 $\mu$m.

According to this mode, the width of the alloy film may be its thickness. Therefore, the alloy film may be formed to have a thickness of not more than about 1 $\mu$m.

In the second aspect of the present invention, the width of the alloy film is more preferably not more than 50 nm, and most preferably not more than 20 nm.

According to each of the first and second aspects of the present invention, the non-magnetic layer has conductivity, and is made of a metal or an alloy.

A method according to a third aspect of the present invention, which can prepare the aforementioned magnetoresistive device according to the second aspect, comprises the steps of forming a mask film which is provided with stripe-shaped grooves or openings on a substrate, forming an alloy film on portions of the substrate located in the stripe-shaped grooves and on the mask film, and removing the mask film from the substrate for leaving on the substrate only portions of the alloy film which are formed in the stripe-shaped grooves of the mask film, thereby defining the alloy film in the form of stripes.

In the method according to the third aspect of the present invention, the stripe-shaped grooves can be formed in the mask film by patterning the mask film by electron beam lithography or photolithography which is generally employed in semiconductor fabrication steps. The width of the stripe-shaped grooves can be properly set in correspondence to that of the finally formed stripes of the alloy film, to be preferably not more than about 1 $\mu$m, more preferably not more than 50 nm, and most preferably not more than 20 nm, similarly to the aforementioned second aspect of the present invention.

In the method according to the third aspect of the present invention, the alloy film is not particularly restricted in method of formation but can be formed by vacuum deposition or RF sputtering, for example.

Further, the mask film can be removed by a method which is generally employed for removing a mask film in semiconductor fabrication steps.

According to each of the aforementioned aspects of the present invention, the alloy film of the ferromagnetic substance and the non-magnetic substance which is not soluble in solid phase or is in eutectic relation with the ferromagnetic substance is employed as a magnetoresistive film. When Co is employed as the ferromagnetic substance, the non-magnetic substance which is in eutectic relation with this Co can be prepared from Cu, for example. Therefore, a CoCu alloy film can be employed.

When Co is employed as the ferromagnetic substance, further, the non-magnetic substance which is not soluble in solid phase in this Co can be prepared from Ag or Pb. Therefore, a CoAg alloy film or a CoPb alloy film can be employed. V, Cr or Mn can be added to the ferromagnetic substance of Co forming such an alloy.

When the ferromagnetic substance is Fe, on the other hand, Ag, Bi, Mg or Pb can be employed as the non-magnetic substance which is not soluble in solid phase in the ferromagnetic substance. Therefore, an FeAg alloy film, an FeBi alloy film, an FeMg alloy film or an FePb alloy film can be employed. Co, Ni, Cu or Zn can be further added to the ferromagnetic substance of Fe forming such an alloy.

When Ni is employed as the ferromagnetic substance, further, Ag can be employed as the non-magnetic substance which is not soluble in solid phase in this Ni. Therefore, an NiAg alloy film can be employed. V, Cr or Mn can be added to the ferromagnetic substance of Ni forming such an alloy film.

The alloy film can be formed as a thin film in which the ferromagnetic substance forms grains in the non-magnetic substance by vacuum deposition or RF sputtering.

In the first aspect of the present invention, the ferromagnetic substance forms grains in the non-magnetic substance forming the alloy film, and the grains of the ferromagnetic substance have form anisotropy. In such an alloy film containing the grains of the ferromagnetic substance in a dispersed manner i.e. dispersed throughout the alloy film, the magnetization state of the grains changes from random arrangement to ferromagnetic arrangement with an increase of an applied magnetic field, and the scattering state of conduction electrons remarkably varies with the magnetization state of the grains in the matrix of the non-magnetic substance enclosing the grains. Consequently, the magnetoresistance ratio of the alloy film is increased. In such an alloy film containing the grains of the ferromagnetic substance, the magnetoresistance ratio is further increased with respect to a specific magnetic field direction due to the form anisotropy of the ferromagnetic grains. Thus, it is possible to further increase magnetic field sensitivity by applying the magnetic field in such a direction and detecting change in electric resistance.

In the second aspect of the present invention, the width of the alloy film is not more than about 1 μm. The inventors have discovered that the magnetoresistance ratio of the alloy film is increased with respect to a specific direction when the film is formed to have such a narrow width of not more than about 1 μm. It is presumed that grains having form anisotropy are formed in the alloy film due to the narrow width thereof. In the magnetoresistive device according to the second aspect of the present invention, the magnetoresistance ratio is increased with respect to a specific direction, whereby magnetic field sensitivity can be improved by applying the magnetic field in this direction and measuring change in electric resistance.

In the method according to the third aspect of the present invention, the aforementioned magnetoresistive device according to the second aspect can be prepared to have an alloy film of a desired width through simple steps.

A magnetoresistive film according to a fourth aspect of the present invention has a non-magnetic layer which is provided between first and second magnetic layers, so that grains of magnetic substance are contained in the non-magnetic layer in a dispersed manner.

In the fourth aspect of the present invention, the first and second magnetic layers are preferably ferromagnetic layers respectively.

According to the fourth aspect of the present invention, the non-magnetic layer has electrical conductivity, and is made of a metal or an alloy.

In the fourth aspect of the present invention, the first and second magnetic layers may have the same composition and the same coercive force. In this case, the aforementioned artificial lattice type magnetoresistive film is obtained.

In the fourth aspect of the present invention, the first and second magnetic layers may alternatively be different in coercive force from each other. The aforementioned spin valve type multilayer magnetic film has such a structure.

In the fourth aspect of the present invention, the proportion of the grains of the magnetic substance which are dispersed in the non-magnetic layer is preferably not more than 50 percent by weight of the overall non-magnetic layer, and more preferably in the range of 10 to 35 percent by weight. If the content of the magnetic grains is too small, magnetic scattering intensity may be so weakened that the MR properties cannot be sufficiently improved. If the content of the magnetic grains is too large, on the other hand, the first and second magnetic layers may be disadvantageously magnetically coupled with each other to deteriorate MR properties.

The grain sizes are preferably about 10 to 200 Å.

In the fourth aspect of the present invention, the nonmagnetic substance for forming the non-magnetic layer is preferably prepared from Cu, while the magnetic grains are preferably prepared from a soft magnetic material such as Co or an alloy such as Permalloy or NiFeCo.

In the fourth aspect of the present invention, the magnetic grains are contained in the non-magnetic layer in a dispersed manner i.e. the grains are dispersed throughout the non-magnetic layer. While the reason why presence of the grains in the non-magnetic layer results in a high magnetoresistance ratio is not yet clarified in detail, it is conceivable that conduction electrons contained in the non-magnetic layer are strongly magnetically scattered due to the presence of the magnetic grains which increase magnetic resistance under a weak magnetic field, leading to a higher magnetoresistance ratio as compared with that in the prior art.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Example 1

Figure 1A:
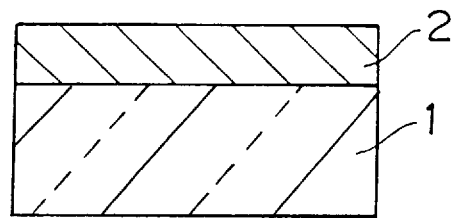
FIGS. 1(a) to 1(d) are sectional views schematically showing steps of preparing a magnetoresistive device according to Example 1 of the present invention.
Figure 1B:
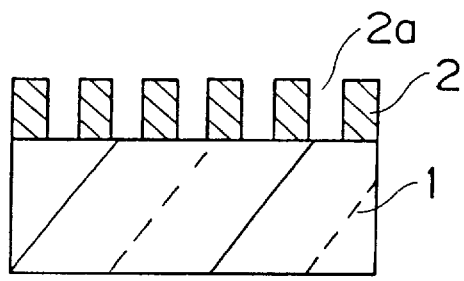

FIGS. 1(a) to 1(d) are sectional views schematically showing steps of preparing a magnetoresistive device according to Example 1 of the present invention. Referring to FIG. 1(a), a mask film 2 of 1 μm in thickness consisting of a resist material or the like was applied onto a substrate 1 of glass or the like. Referring to FIG. 1(b), stripe-shaped grooves or openings 2a were formed in the mask film 2 by electron beam lithography. According to Example 1, each stripe-shaped groove 2a was 5000 Å (0.5 μm) in width, and each stripe of the mask film 2 was also 5000 Å in width.

Figure 1C:
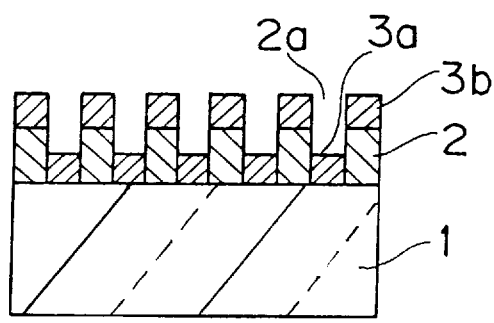

Referring to FIG. 1(c), a CoAg alloy film was deposited by RF sputtering. Alloy films 3b and 3a were formed on the stripes of the mask film 2 and on the substrate 1 in the stripe-shaped grooves 2a respectively. The alloy films 3a and 3b were 500 Å in thickness.

Figure 1D:
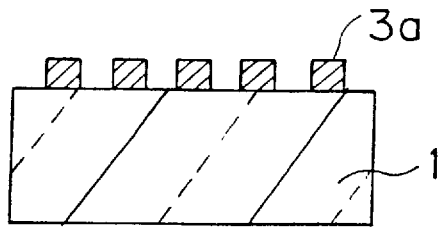

Referring to FIG. 1(d), the mask film 2 was lifted off to leave only portions of the alloy film 3a formed in the stripe-shaped grooves 2a on the substrate 1. Thus, alloy film stripes 3a of 5000 Å in width and 500 Å in thickness were formed on the substrate 1.

Figure 2:
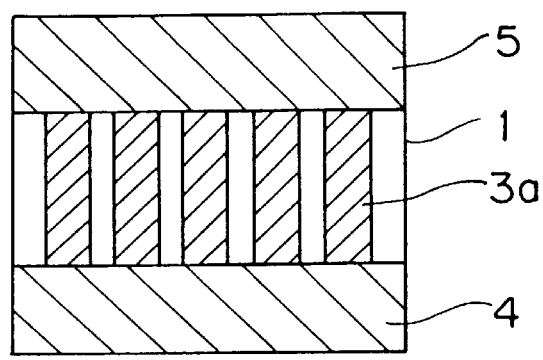
FIG. 2 is a plan view showing a magnetic alloy film, obtained through the steps shown in FIGS. 1(a) to 1(d), provided with electrodes.

FIG. 2 shows Cu electrodes 4 and 5 of 1000 Å in thickness which were formed on both ends of the alloy film stripes 3a obtained in the aforementioned manner.

The CoAg alloy film of Example 1 contained 20 atomic percent of Co and 80 atomic percent of Ag.

Since Co is not soluble in solid phase Ag, the Co formed grains in the CoAG alloy film. It is presumed that the grains had flat shapes spreading along the longitudinal direction of the stripes or were in the form of rugby balls since the same were formed in the extremely narrow grooves of the mask film in formation of the CoAg alloy film.

The magnetoresistive device obtained in the aforementioned manner was subjected to measurement of the MR ratio and the operating magnetic field. A magnetoresistive device of comparative example 1 was prepared by directly forming a CoAg alloy film on a substrate in a thickness similar to that of Example 1 without using a mask film and forming electrodes on this magnetoresistive film, and subjected to measurement of the MR ratio and the operating magnetic field similarly to the above. Table 1 shows the results.

TABLE 1

| Inventive Sample 1 | | Comparative Sample 1 | |
| --- | --- | --- | --- |
| MR Ratio (%) | Hs (Oe) | MR Ratio (%) | Hs (Oe) |
| 35 | 110 | 20 | Unsaturated |

It is clearly understood from Table 1 that the inventive magnetoresistive device having an alloy film in the form of stripes exhibited a high MR ratio, with a small operating magnetic field and high magnetic field sensitivity.

Figure 3:
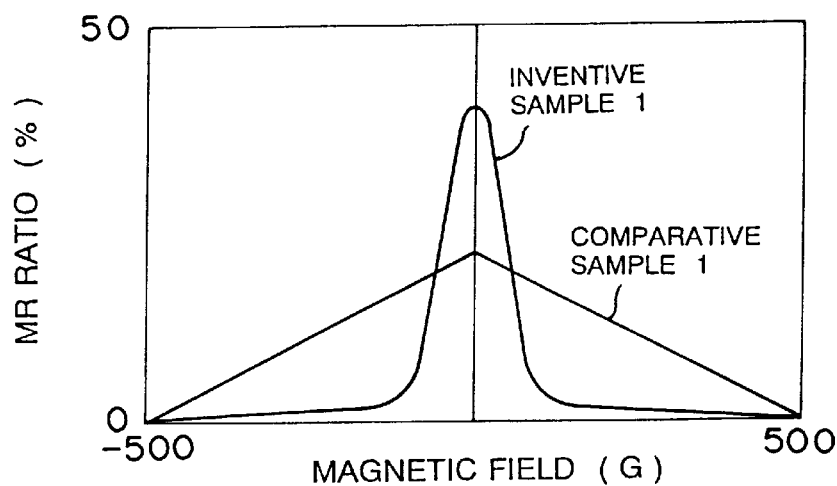
FIG. 3 illustrates magnetic field dependence of MR ratios in Example 1 of the present invention and comparative example 1.

FIG. 3 illustrates magnetic field dependence of the MR ratios of inventive Example 1 and comparative example 1. As clearly understood from FIG. 3, Example 1 according to the present invention exhibited an extremely high MR ratio.

In Example 1, a magnetic field was applied perpendicularly to the longitudinal direction of the stripes. In this case, magnetic properties substantially similar to those of comparative example 1 were obtained.

Example 2

Alloy film stripes were formed similarly to Example 1, except that the CoAg alloy film was replaced by an NiFeAg alloy film. This alloy film had a composition of (Ni80Fe20) 20Ag80 (numerals: atomic percent). NiFe formed grains of a ferromagnetic substance, and Ag served as a non-magnetic substance.

A magnetoresistive device thus obtained similarly to that of Example 1 was subjected to measurement of the MR ratio and the operating magnetic field. A magnetoresistive device of comparative example 2 was prepared by forming an ordinary alloy film, which was not in the form of stripes, on a substrate similarly to Example 1, and subjected to measurement of the MR ratio and the operating magnetic field. Table 2 shows the results.

TABLE 2

| Inventive Sample 2 | | Comparative Sample 2 | |
| --- | --- | --- | --- |
| MR Ratio (%) | Hs (Oe) | MR Ratio (%) | Hs (Oe) |
| 25 | 75 | 6.5 | Unsaturated |

As clearly understood from Table 2, Example 2 according to the present invention exhibited a high MR ratio and high magnetic field sensitivity, similarly to Example 1.

Figure 4:
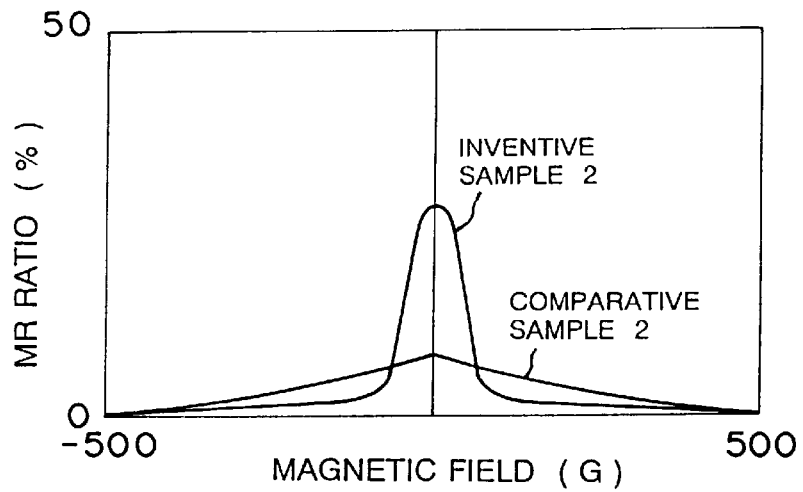
FIG. 4 illustrates magnetic field dependence of MR ratios in Example 2 of the present invention and comparative example 2.

FIG. 4 illustrates magnetic field dependence of the MR ratios of inventive Example 2 and comparative example 2. As clearly understood from FIG. 4, the magnetoresistive device according to Example 2 exhibited a high MR ratio.

According to the present invention, the ferromagnetic and non-magnetic substances forming the alloy film may be not soluble in solid phase or may be in eutectic relation with each other, and are not restricted to those employed in Examples 1 and 2. Further, the methods of forming the alloy film in the form of stripes of prescribed widths are not restricted to those of Examples 1 and 2, but any method can be employed so far as the alloy film can be provided in the form of stripes.

According to the first aspect, the present invention is not restricted to the aforementioned formation of the alloy film in the form of stripes but grains of the ferromagnetic substance may alternatively be provided with form anisotropy by another method.

According to the first or second aspect of the present invention, it is possible to provide a magnetoresistive device having a high MR ratio and a small operating magnetic field, i.e., high magnetic field sensitivity.

In the method according to the third aspect of the present invention, it is possible to prepare the alloy film according to the first or second aspect of the present invention through simple steps.

Example 3

Figure 5A:
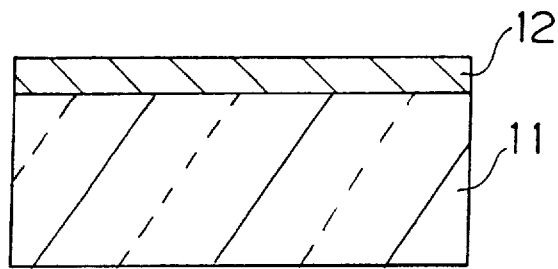
FIGS. 5(a) to 5(c) are sectional views schematically showing steps of preparing a magnetoresistive device of Example 3 according to the fourth aspect of the present invention.
Figure 5B:
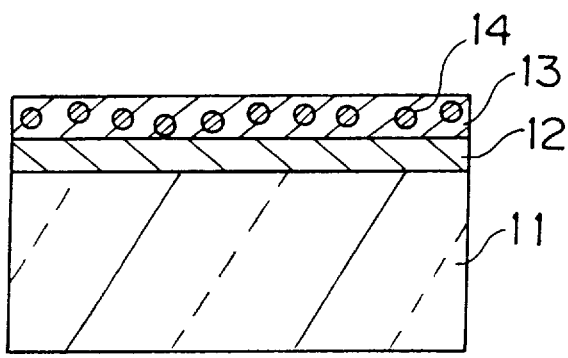
Figure 5C:
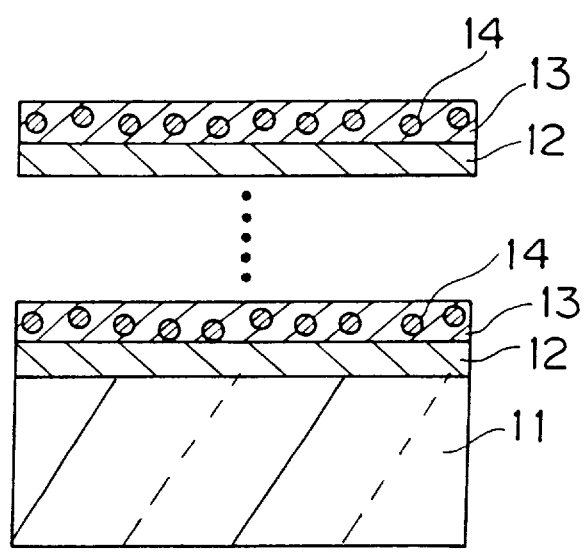

FIGS. 5(a) to 5(c) are sectional views schematically showing steps of preparing a magnetoresistive film according to an Example of the fourth aspect of the present invention.

Referring to FIG. 5(a), a Co layer 12 of 15 Å in thickness was formed on a substrate 11 of glass or the like as a magnetic layer by RF sputtering.

Referring to FIG. 5(b), a Cu layer 13 of 20 Å in thickness, containing grains 14 of Co, was formed on the Co layer 12 as a non-magnetic layer by RF sputtering. A target was a Cu target with a Co chip thereon. Since Cu and Co are in eutectic relation with each other, Co grew in the form of grains, to form the Co grains 14 in the Cu layer 13. In this Example, the Cu layer 13 contained 20 percent by weight of the Co grains 14.

Referring to FIG. 5(c), the aforementioned Co and Cu layers 12 and 13 were repeatedly stacked 15 times, to prepare a magnetoresistive film having 15 units of the Co and Cu layers 12 and 13.

The magnetoresistive film prepared in this Example was the so-called artificial lattice type multilayer film. In such an artificial lattice type multilayer film, the proper thickness for each non-magnetic layer is about 10 to 50 Å in general.

The multilayer film obtained in the aforementioned manner was subjected to measurement of the MR ratio and the operating magnetic field. A magnetoresistive film of comparative example 3 was prepared similarly to Example 3, except that a Cu layer containing no Co grains was employed, and subjected to measurement of the MR ratio and the operating magnetic field. Table 3 shows the results.

TABLE 3

| Inventive Sample 3 | | Comparative Sample 3 | |
|---|---|---|---|
| MR Ratio (%) | Hs (Oe) | MR Ratio (%) | Hs (Oe) |
| 48 | Unsaturated | 28 | Unsaturated |

Figure 6:
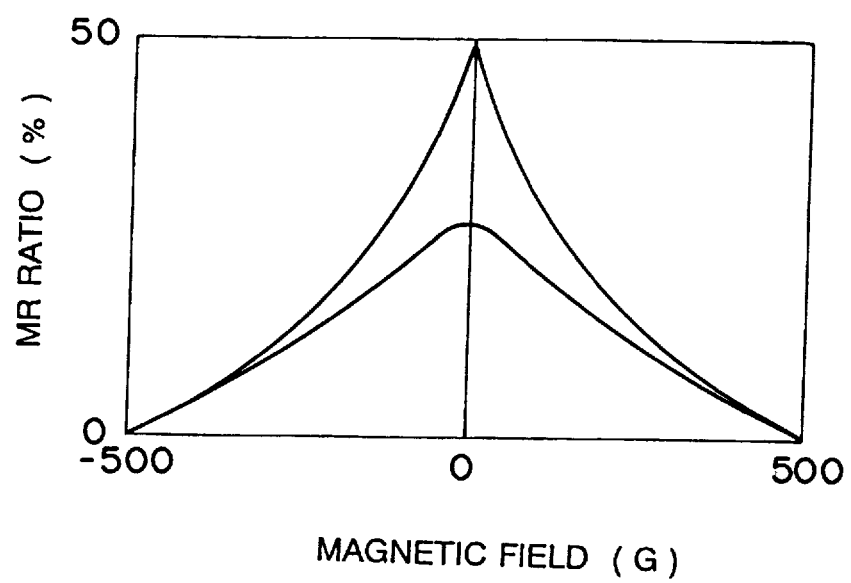
FIG. 6 illustrates magnetic field dependence of MR ratios in Example 3 of the invention and comparative example 3.

FIG. 6 illustrates magnetic field dependence of the MR ratios of Example 3 and comparative example 3.

It is clearly understood from Table 3 and FIG. 6 that the magnetoresistive film according to the fourth aspect of the present invention exhibited a high MR ratio, as well as high magnetic field sensitivity.

Example 4

FIGS. 7(a) to 7(d) are sectional views schematically showing steps of preparing a magnetoresistive film according to another Example of the fourth aspect of the present invention.

Figure 7A:
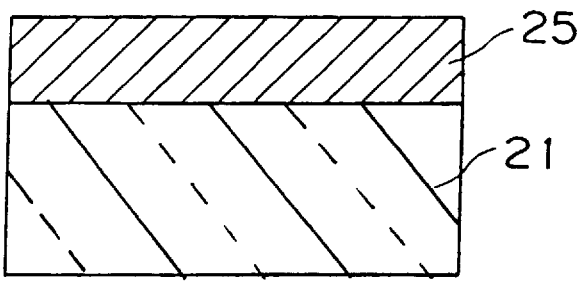
FIGS. 7(a) to 7(d) are sectional views schematically showing steps of preparing a magnetoresistive device of Example 4 according to the fourth aspect of the present invention.

Referring to FIG. 7(a), an MnFe layer 25 of 80 Å in thickness was formed on a substrate 21 of glass by RF sputtering. The ratio of Mn:Fe was 50:50.

Figure 7B:
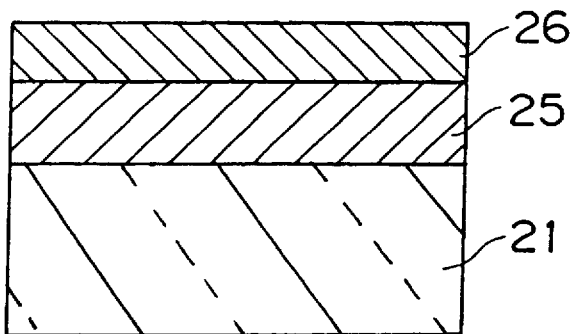

Referring to FIG. 7(b), an NiFe layer 26 of 50 Å in thickness was formed on the MnFe layer 25 by RF sputtering. The ratio Ni:Fe was 80:20.

Figure 7C:
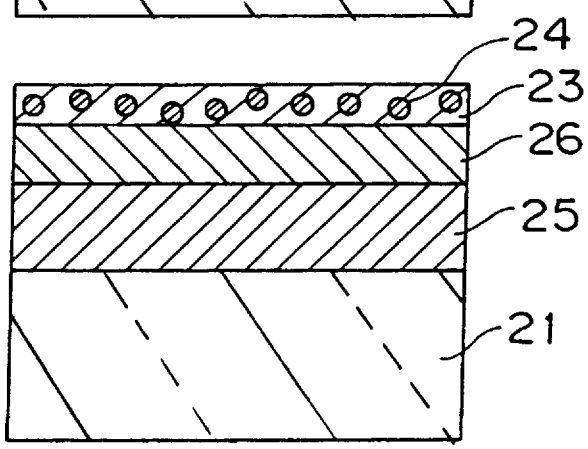

Referring to FIG. 7(c), a Cu layer 23 of 22 Å in thickness containing grains 24 consisting of Co was formed on the NiFe layer 26 by RF sputtering. The content of Co was 20 percent by weight.

Figure 7D:
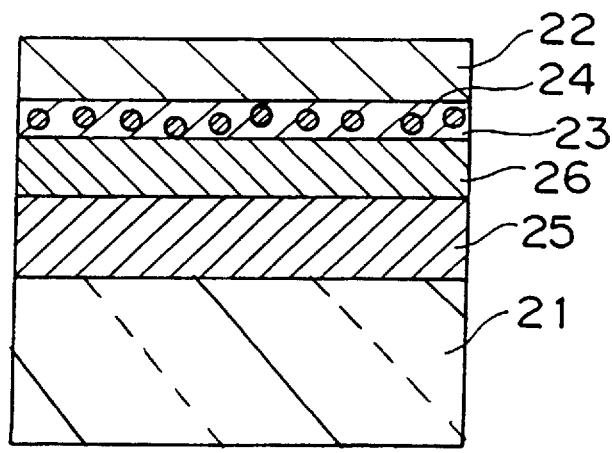

Referring to FIG. 7(d), a Co layer 22 of 75 Å in thickness was formed on the Cu layer 23 by RF sputtering.

Thus, a magnetoresistive film of a sandwich structure having a multilayer film, which was a first magnetic layer, of the MnFe layer 25 and the NiFe layer 26, and the Co layer 22, which was a second magnetic layer, through with the Cu layer 23 containing the Co grains 24 sandwiched therebetween. In a magnetoresistive film having such a structure, the proper thickness of the Cu layer is about 10 to 50 Å in general.

The multilayer film obtained in the aforementioned manner was subjected to measurement of the MR ratio and the operating magnetic field. A magnetoresistive film of comparative example 4 was prepared similarly to inventive Example 4 except that a Cu layer containing no Co grains was employed, and subjected to measurement of the MR ratio and the operating magnetic field. Table 4 shows the results.

TABLE 4

| Inventive Sample 4 | | Comparative Sample 4 | |
|---|---|---|---|
| MR Ratio (%) | Hs (Oe) | MR Ratio (%) | Hs (Oe) |
| 19.5 | 32 | 10.5 | 32 |

Figure 8:
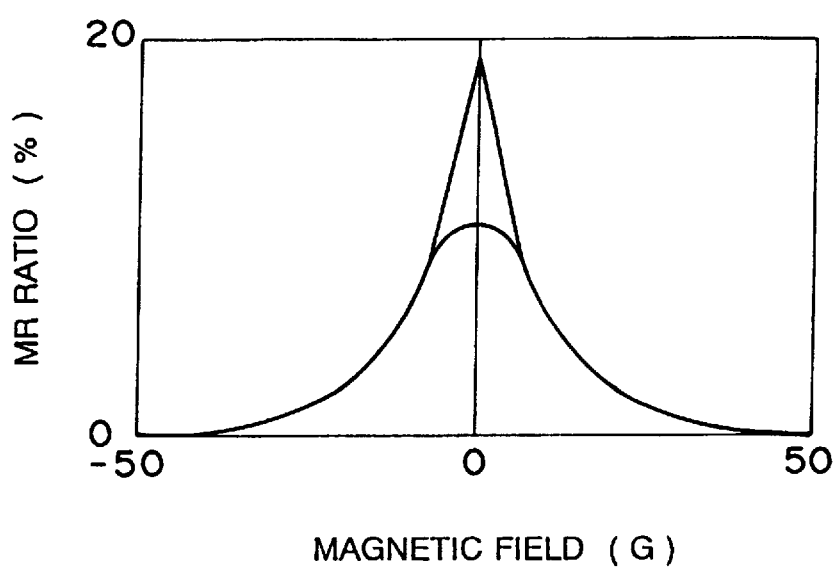
FIG. 8 illustrates magnetic field dependence of MR ratios in inventive Example 4 and comparative example 4.

FIG. 8 illustrates magnetic field dependence of the MR ratios of inventive Example 4 and comparative example 4.

It is clearly understood from Table 4 and FIG. 8 that the magnetoresistive film according to Example 4 of the fourth aspect of the present invention exhibited a high MR ratio, as well as high magnetic field sensitivity.

In the aforementioned magnetoresistive film, a difference in magnetization process was caused between the first magnetic layer consisting of the MnFe layer 25 and the NiFe layer 26 and the second magnetic layer consisting of the Co layer 22, since the MnFe layer 25 was made of an antiferromagnetic substance, whereby a region having antiparallel magnetic moment was present due to magnetic field strength, to maximize the magnetic resistance. It is conceivable that conduction electrons in the Cu layer 23 were magnetically strongly scattered due to the presence of the Co grains 24 in the Cu layer 23 to further increase the magnetic resistance under a weak magnetic field in this Example.

While Example 4 shown in FIGS. 7(a) to 7(d) was provided with a single unit consisting of the Co layer 22, the Cu layer 23, the MnFe layer 25 and the NiFe layer 26, the present invention is also applicable to a structure having a plurality of such units which are stacked with each other.

Example 5

Figure 9A:
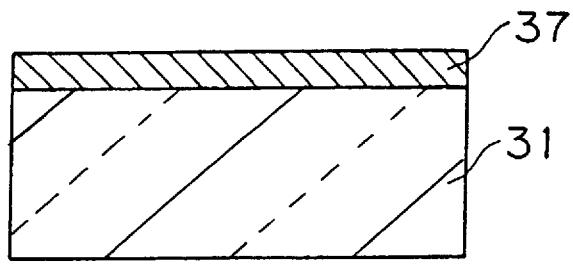
FIGS. 9(a) to 9(c) are sectional views schematically showing steps of preparing a magnetoresistive device of Example 5 according to the fourth aspect of the present invention.
Figure 9B:
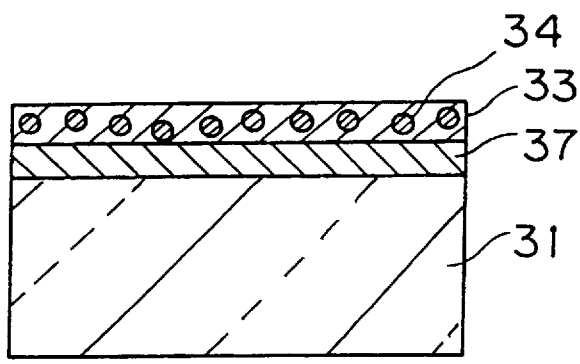
Figure 9C:
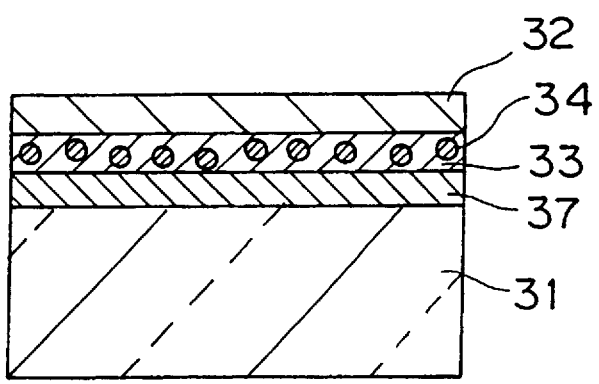

FIGS. 9(a) to 9(c) are sectional views schematically showing steps of preparing a magnetoresistive film according to still another Example of the fourth aspect of the present invention.

Referring to FIG. 9(a), an Fe layer 37 of 56 Å in thickness was formed on a substrate 31 of glass or the like by RF sputtering.

Referring to FIG. 9(b), a Cu layer 33 of 50 Å in thickness containing grains 34 consisting of Co was formed on the Fe layer 37 by RF sputtering. According to this Example, the content of the Co grains 34 was 20 percent by weight.

Referring to FIG. 9(c), a Co layer 32 of 48 Å in thickness was formed on the Cu layer 33 by RF sputtering. In a magnetoresistive film of such a structure, the proper thickness of the Cu layer is about 10 to 50 Å in general.

The multilayer film obtained in the aforementioned manner was subjected to measurement of the MR ratio and the operating magnetic field. A magnetoresistive film of comparative example 5 was prepared similarly to Example 5 except that a Cu layer containing no Co grains was employed, and subjected to measurement of the MR ratio and the operating magnetic field. Table 5 shows the results.

TABLE 5

| Inventive Sample 5 | | Comparative Sample 5 | |
| --- | --- | --- | --- |
| MR Ratio (%) | Hs (Oe) | MR Ratio (%) | Hs (Oe) |
| 14.8 | 20 | 7.8 | 27 |

Figure 10:
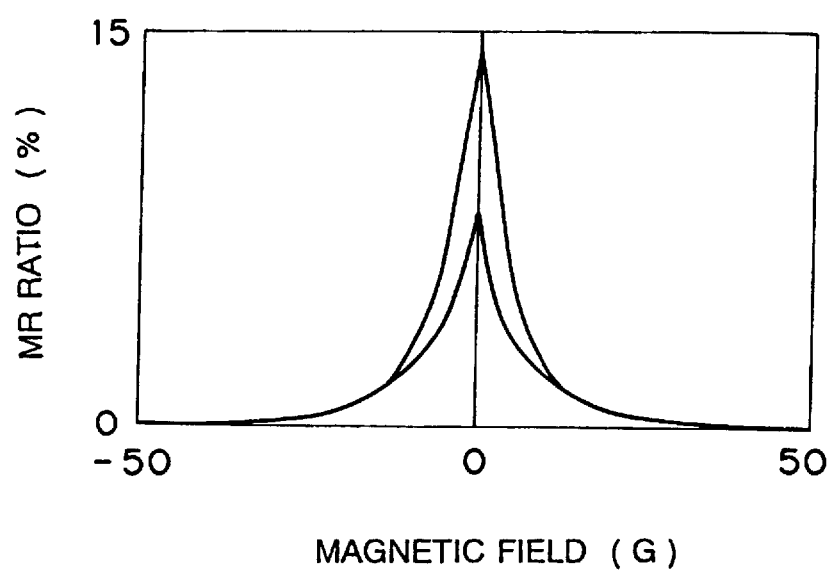
FIG. 10 illustrates magnetic field dependence of MR ratios in Example 5 and comparative example 5.

FIG. 10 illustrates magnetic field dependence of the MR ratios of inventive Example 5 and comparative example 5.

It is clearly understood from Table 5 and FIG. 10 that the magnetoresistive film according to Example 5 of the fourth aspect of the present invention exhibited a high MR ratio, as well as high magnetic field sensitivity.

In the aforementioned magnetoresistive film, the Fe layer 37 and the Co layer 32 exhibited soft magnetism and hard magnetism respectively, whereby a region having antiparallel magnetic moment was caused by difference in coercive force in the magnetization process, to maximize the magnetic resistance. If the magnetic field strength is further increased in this case, the magnetic moment becomes parallel to reduce the resistance. It is conceivable that conduction electrons contained in the Cu layer 33 were magnetically strongly scattered due to the presence of the Co grains 34 in the Cu layer 33, to further increase the magnetic resistance under a weak magnetic field, leading to a high MR ratio.

While inventive Example 5 shown in FIGS. 9(a) to 9(c) was provided with a single unit consisting of the Co layer 32, the Cu layer 33 and the Fe layer 37, the present invention is also applicable to a structure having a plurality of such units which are stacked with each other.

In the magnetoresistive film according to the fourth aspect of the present invention, grains consisting of a magnetic substance are contained in the non-magnetic layer in a dispersed manner. Due to the presence of such grains, conduction electrons contained in the non-magnetic layer are magnetically strongly scattered so that magnetic resistance under a weak magnetic field causing an antiparallel magnetic moment is increased as compared with the prior art. Consequently, a high MR ratio is attained, to be capable of improving magnetic field sensitivity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A magnetoresistive device comprising:

first and second magnetic layers; and a non-magnetic layer arranged between and in contact with said first and second magnetic layers;

wherein said non-magnetic layer comprises a non-magnetic substance and grains of a magnetic substance dispersed in said non-magnetic substance, wherein said magnetic substance is in eutectic relation with said non-magnetic substance, and wherein a proportional content of said grains in said non-magnetic layer is in the range from 10 to 50 weight percent.

2. The magnetoresistive device in accordance with claim 1, wherein said first magnetic layer has a substantially same composition and a substantially same coercive force as said second magnetic layer.

3. The magnetoresistive device in accordance with claim 2, wherein said first and second magnetic layers are ferromagnetic layers.

4. The magnetoresistive device in accordance with claim 1, wherein said first and second magnetic layers have respective different coercive forces.

5. The magnetoresistive device in accordance with claim 4, wherein said first and second magnetic layers are ferromagnetic layers.

6. The magnetoresistive device in accordance with claim 1, wherein either one of said first and second magnetic layers is a multilayer film comprising antiferromagnetic and ferromagnetic layers.

7. The magnetoresistive device in accordance with claim 1, wherein said non-magnetic substance is Cu and said magnetic substance is Co.

8. The magnetoresistive device in accordance with claim 1, comprising a plurality of said first and of said second magnetic layers, and a plurality of said non-magnetic layer, wherein said first and second magnetic layers are stacked alternately with said non-magnetic layers therebetween so as to form a plurality of units of said first and second magnetic layers with respective ones of said non-magnetic layers therebetween.

9. The magnetoresistive device in accordance with claim 1, wherein said proportional content of said grains in said non-magnetic layer is in the range from 10 to 35 weight percent.

10. The magnetoresistive device of claim 1, wherein said first and second magnetic layers respectively have first and second coercive forces that are different from one another, and wherein said proportional content of said grains of said magnetic substance in said non-magnetic layer is in the range from 10 to 35 weight percent.

11. A magnetoresistive device comprising a substrate, an alloy film composed of a plurality of alloy film stripes arranged side-by-side adjacent one another on said substrate, a first common electrode arranged in contact with a respective first end of each of said plurality of alloy film stripes, and a second common electrode arranged in contact with a respective second end opposite said respective first end of each of said plurality of alloy film stripes, wherein said alloy film comprises a conductive non-magnetic substance and grains of a ferromagnetic substance in said non-magnetic substance, wherein said alloy film stripes respectively extend longitudinally in an extension direction, and respectively have at least one dimension perpendicular to said extension direction that is not more than 1 µm, wherein said at least one dimension includes a width dimension and a thickness dimension, wherein said width dimension and said thickness dimension are respectively not more than 1 µm and at least one of said width dimension and said thickness dimension is not more than 50 nm, wherein said alloy film stripes are respectively spaced apart from one another at a spacing distance of not more than 1 µm, wherein said grains of said ferromagnetic substance respectively have an anisotropic shape with a relatively longest dimension and a relatively shortest dimension, wherein said relatively longest dimension is 1.3 to 3 times said relatively shortest dimension, and wherein said ferromagnetic substance is non-soluble in solid phase in said non-magnetic substance.

12. The magnetoresistive device in accordance with claim 11, wherein said plurality of alloy film stripes comprises plural independent alloy film stripes connected in parallel with each other and electrically isolated from each other along a respective length thereof.

13. A magnetoresistive device comprising a substrate, an alloy film composed of a plurality of alloy film stripes arranged side-by-side side adjacent one another on said substrate, a first common electrode arranged in contact with A respective first end of each of said plurality of alloy film stripes, and a second common electrode arranged in contact with a respective second end opposite said respective first end of each of said plurality of alloy film stripes, wherein said alloy film comprises a conductive non-magnetic substance and grains of a ferromagnetic substance in said non-magnetic substance, wherein said alloy film stripes respectively extend longitudinally in an extension direction, and respectively have at least one dimension perpendicular to said extension direction that is not more than 1 µm, wherein said at least one dimension includes a width dimension and a thickness dimension, wherein said width dimension and said thickness dimension are respectively not more than 1 µm and at least one of said width dimension and said thickness dimension is not more than 50 nm, wherein said alloy film stripes are respectively spaced apart from one another at a spacing distance of not more than 1 µm, wherein said grains of said ferromagnetic substance respectively have an anisotropic shape with a relatively longest dimension and a relatively shortest dimension, wherein said relatively longest dimension is 1.3 to 3 times said relatively shortest dimension, and wherein said ferromagnetic substance is in eutectic relation with said non-magnetic substance.

14. The magnetoresistive device in accordance with claim 13, wherein said plurality of alloy film stripes comprises plural independent alloy film stripes connected in parallel with each other and electrically isolated from each other along a respective length thereof.

15. A magnetoresistive device comprising a substrate and an alloy film composed of a plurality of alloy film stripes arranged side-by-side adjacent one another on said substrate, wherein said alloy film comprises a conductive non-magnetic substance and grains of a ferromagnetic substance in said nonmagnetic substance, wherein said plurality of alloy film stripes comprises plural independent alloy film stripes connected in parallel with each other and electrically isolated from each other along a respective length thereof, wherein said alloy film stripe respectively extend longitudinally in an extension direction, and respectively have at least one dimension perpendicular to said extension direction that is not more than 1 µm, wherein said at least one dimension includes a width dimension and a thickness dimension, wherein said width dimension and said thickness dimension are respectively not more than 1 µm and at least one of said width dimension and said thickness dimension is not more than 50 nm, wherein said alloy film stripes are respectively spaced apart from one another at a spacing distance of not more than 1 µm, wherein said grains of said ferromagnetic substance respectively have an anisotropic shop with a relatively longest dimension and a relatively shortest dimension, wherein said relatively longest dimension is 1.3 to 3 times said relatively shortest dimension, and wherein said ferromagnetic substance is non-soluble in solid phase in said non-magnetic substance.

16. The magnetoresistive device in accordance with claim 15, further comprising a first common electrode arranged in contact with a respective first end of each of said plural independent alloy film stripes, and a second common electrode arranged in contact with a respective second end opposite said respective first end of said each of said plural independent alloy film stripes.

17. A magnetoresistive device comprising a substrate and an alloy film composed of a plurality of alloy film, stripes arranged side-by-side adjacent one another on said substrate, wherein aid alloy film comprises a conductive non-magnetic substance and grains of a ferromagnetic substance in said non-magnetic substance, wherein said plurality of alloy film stripes comprises plural independent alloy film stripes connected in parallel with each other and electrically isolated from each other along a respective length thereof, wherein said alloy film stripes respectively extend longitudinally in an extension direction, and respectively have at least one dimension perpendicular to said extension direction that is not more than 1 µm, wherein said at least one dimension including a width dimension and a thickness dimension, wherein said width dimension and said thickness dimension are respectively not more than 1 µm and at least one of said width dimension and said thickness dimension is not more than 50 nm, wherein said alloy film stripes are respectively spaced apart from one another at a spacing distance of not more than wherein said grains of said ferromagnetic substance respectively have an anisotropic shape with a relatively longest dimension and a relatively shortest dimension, wherein said relatively longest dimension is 1.3 to 3 times said relatively shortest dimension, and wherein said ferromagnetic substance is in eutectic relation with said non-magnetic substance.

18. The magnetoresistive device in accordance with claim 17, further comprising a first common electrode arranged in contact with a respective first end of each of said plural independent alloy film stripes, and a second common electrode arranged in contact with a respective second end opposite said respective first end of said each of said plural independent alloy film stripes.

* * * * *

UNITED STATES PATENT AND TRADEMARK OFFICE
CERTIFICATE OF CORRECTION

PATENT NO. : 5,818,323
DATED : Oct. 6, 1998
INVENTOR(S) : Maeda et al.

Page 1 of 2

It is certified that error appears in the above-identified patent and that said Letters Patent is hereby corrected as shown below:

On the title page, under [75] Inventors:, line 1, after "Maeda," replace "Neyagawa;" by --Jyoto;--;

under [56] "Attorney, Agent, or Firm" after "W." (sec. occurence) replace "F." by --G.--;

under [57] ABSTRACT, line 4, after "the" replace "ferromagentic" by --ferromagnetic--;

| | | |
|---|---|---|
| Col. 1, | line 5, | after "following" insert --copending--; |
| Col. 4, | line 47, | after "the" (third occurence) replace "nonmag-" by --non-mag---; |
| | line 54, | after "manner" insert --,--; |
| | line 60, | after "grains" insert --,--; |
| | | after "which" replace "increase" by --increases--; |

UNITED STATES PATENT AND TRADEMARK OFFICE
CERTIFICATE OF CORRECTION

PATENT NO. : 5,818,323  
DATED : Oct. 6, 1998  
INVENTOR(S) : Maeda et al.

Page 2 of 2

It is certified that error appears in the above-identified patent and that said Letters Patent is hereby corrected as shown below:

Col. 7, line 32, after "target" insert --for the RF sputtering--;

Col. 12, line 3, after "film" replace "stripe" by --stripes--;
line 17, after "anisotropic" replace "shop" by --shape--;
line 31, after "film" (second occurrence) delete ",";
line 33, after "wherein" replace "aid" by --said--;
line 44, after "dimension" replace "including" by --includes--;
line 52, after "than" insert --1μm,--.

Signed and Sealed this

Second Day of March, 1999

Attest:

Q. TODD DICKINSON

*Attesting Officer*     Acting Commissioner of Patents and Trademarks